United States Patent
Ha

[11] Patent Number: 6,025,216
[45] Date of Patent: Feb. 15, 2000

[54] TFT-LCD METHOD FOR MANUFACTURING THE SAME

[75] Inventor: Yong-Min Ha, Kyongki-do, Rep. of Korea

[73] Assignee: LG Electronics Inc., Seoul, Rep. of Korea

[21] Appl. No.: 09/105,044

[22] Filed: Jun. 26, 1998

Related U.S. Application Data

[62] Division of application No. 08/704,345, Aug. 28, 1996, Pat. No. 5,811,836.

[30] Foreign Application Priority Data

Aug. 29, 1995 [KR] Rep. of Korea .................. 95-26997

[51] Int. Cl.[7] ......................................... H01L 29/04
[52] U.S. Cl. .......................... 438/161; 438/151; 257/49
[58] Field of Search ............................ 438/149, 151, 438/161, 197, 482, 484, 30; 349/5, 73, 74, 148; 257/49, 56, 59, 72

[56] References Cited

U.S. PATENT DOCUMENTS

| | | |
|---|---|---|
| 5,003,356 | 3/1991 | Wakai et al. .......................... 357/4 |
| 5,500,538 | 3/1996 | Yamazaki et al. ..................... 257/49 |
| 5,614,731 | 3/1997 | Uchikoga et al. ..................... 257/59 |
| 5,614,732 | 3/1997 | Yamazaki et al. ..................... 257/66 |
| 5,648,662 | 7/1997 | Zhang et al. .......................... 257/59 |
| 5,648,674 | 7/1997 | Weisfield et al. .................... 257/428 |
| 5,790,222 | 2/1997 | Kim . |
| 5,825,449 | 3/1996 | Shin . |
| 5,828,433 | 3/1996 | Shin . |
| 5,872,021 | 12/1994 | Matsumoto et al. . |
| 5,874,326 | 7/1997 | Lyu . |
| 5,874,746 | 7/1995 | Holmberg et al. . |

*Primary Examiner*—Charles Bowers
*Assistant Examiner*—Martin Sulsky
*Attorney, Agent, or Firm*—Morgan, Lewis & Bockius LLP

[57] ABSTRACT

A thin film transistor for a liquid crystal display includes a substrate; an active layer having source and drain regions over the substrate; a first insulating layer adjacent to the active layer and having first and second surfaces, the first surface being on an opposite side to the second surface, and the active layer being adjacent to the second surface of the first insulating layer; a gate electrode adjacent to the first surface of the first insulating layer; a first electrode in contact with the source region; a second electrode in contact with the drain region; a second insulating layer on the second electrode; and a third insulating layer over a resultant structure of the substrate.

16 Claims, 5 Drawing Sheets

TFT-LCD METHOD FOR MANUFACTURING THE SAME

This is a divisional of application Ser. No. 08/704,345 filed on Aug. 28, 1996, now U.S. Pat. No. 5,811,836.

BACKGROUND OF THE INVENTION

1. Field of the Invention

The present invention relates to a liquid crystal display (LCD), and more particularly, to a thin film transistor (TFT) for an LCD (TFT-LCD) and a method for manufacturing the same.

2. Discussion of the Related Art

In an LCD of an active matrix using a TFT, each pixel, the unit of array, has a TFT and a pixel electrode. FIG. 1 shows a conventional pixel structure of an inverted-staggered TFT in which a pixel electrode and a drain electrode of a TFT are made of a same transparent conductive material In order to form such a structure, a gate electrode 11 is formed on a glass substrate 10, and a gate insulating layer 12 is formed thereon. Then, intrinsic amorphous silicon (a-Si:H) and doped amorphous silicon ($n^+$-a-Si:H) are formed sequentially and patterned to form an active layer 13 and an ohmic contact layer 14. A transparent conductive material is deposited on the overall surface of the substrate and patterned to form an integrally formed drain/pixel electrode 15. Subsequently, metal (Al) is deposited on the overall surface of the substrate and patterned to form a source electrode 16.

The portion of the ohmic contact layer 14 at the channel region is etched using the source/drain electrode as a mask. A surface passivation layer 17 is deposited on the overall surface of the substrate so that an inverted-staggered TFT is made. In this structure, the gate electrode 11 is placed over the glass substrate 10, the gate insulating layer 12 is placed over the gate electrode 11, the active layer 13 is formed over the gate insulating layer 12, arid the ohmic contact layer 14 is on both sides of active layer 13 excluding the channel region. An integrally formed drain/pixel electrode 15 (ITO) is formed on one side of the ohmic contact layer 14 and the gate insulating layer 12. The source electrode 16 is located on the other side of the ohmic contact layer 14. A surface passivation layer 17 is formed on the overall surface of the substrate.

FIG. 2 shows a pixel structure of a TFT-LCD having a self-aligned top gate, in which an active region 21 is formed of intrinsic polysilicon over glass substrate 20, and a gate insulating layer 23 is formed on the overall surface of the substrate including the active region 21. Then, a gate electrode 24 is formed on the gate insulating layer 23 over the active region 21. Ion implantation is performed using gate electrode 24 as a mask to form source and drain regions (S/D). An insulating material is formed on the overall surface of the substrate to form an interlevel insulating layer 25, and contact holes are formed in the interlevel insulating layer 25 and the gate insulating layer 23 at the source and drain regions (S/D).

A transparent conductive material is deposited in the contact hole and on the interlevel insulating layer 25, and patterned to integrally form drain/pixel electrode 26. Then, metal is deposited on the overall surface of the substrate and patterned to form a source electrode 27. A surface passivation layer 28 is formed on the overall surface of the substrate. The integrally formed drain/pixel electrode 26 is connected to drain region D via the contact hole formed thereon. The source electrode 27 is connected to source region S via the contact hole formed thereon.

In the pixel structures shown in FIGS. 1 and 2, the drain and pixel electrodes are formed of a single transparent conductive material, thereby simplifying the process. However, the source electrode (signal wire) is formed after the integrally formed drain/pixel electrode is formed. Here, metal (Al) is deposited on the overall surface of the substrate and patterned. Thus, the integrally formed drain/pixel electrode is easily damaged during the etching process of the metal. In particular, this damage is caused by a galvanic effect during wet etching and by plasma damage during dry etching. This results in poor device characteristic and unsatisfactory yield.

SUMMARY OF THE INVENTION

Accordingly, the present invention is directed to a TFT-LCD and a method for manufacturing the same that substantially obviates one or more of the problems due to limitations and disadvantages of the related art.

An object of the present invention is to provide a TFT-LCD preventing the transparent conductive layer from being damaged due to the etchant for forming the source electrode, thus enhancing the device characteristic and the yield.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the TFT-LCD includes a TFT formed on a substrate; and a plurality of pixel electrodes integrally formed with a drain electrode of the TFT, wherein a passivation layer is additionally formed above the integrally formed drain electrode and pixel electrode. The passivation layer formed above the integrally formed drain/pixel electrode is made of a transparent insulating material such as silicon oxide and silicon nitride. By forming the passivation layer acting as a metal etching stop, this embodiment solves the problem of damage in the drain/pixel electrodes due to the metal etchant when metal is etched to form the source electrode.

In another aspect, the method for manufacturing a TFT-LCD includes the steps of forming a gate electrode on a substrate, sequentially stacking a gate insulating layer, semiconductor layer and doped semiconductor layer on the overall surface of the gate electrode and substrate, and sequentially patterning the doped semiconductor layer and semiconductor layer, to thereby form an active layer; sequentially stacking and patterning a transparent conductive layer and transparent insulating layer on one side of the active layer and above the gate insulating layer, to thereby form an integrally formed drain/pixel electrode and passivation layer; and depositing and patterning a metal layer on the overall surface of the substrate to thereby form a source electrode above the other side of the active layer formed on the gate insulating layer and integrally formed drain/pixel electrode.

In a further aspect, the method for manufacturing a TFT-LCD includes the steps of forming an active layer on a substrate; forming a gate insulating layer on the active layer and the overall surface of the substrate; forming a gate electrode on the gate insulating layer; implanting ions into the gate electrode with a mask to thereby form a source/drain region on the active layer; stacking an insulating material above the gate and gate insulating layer to thereby form an interlevel insulating layer; selectively remove the source/drain region on the interlevel insulating layer and gate insulating layer to thereby form a contact hole; sequentially stacking and patterning transparent conductive and insulating layers on the contact hole connecting to the drain region and on the interlevel insulating layer, to thereby form an integrally formed drain/pixel electrode and surface passivation layer; and stacking and patterning a metal layer above the contact hole connected to the source region and the interlevel insulating layer, to thereby form a source electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
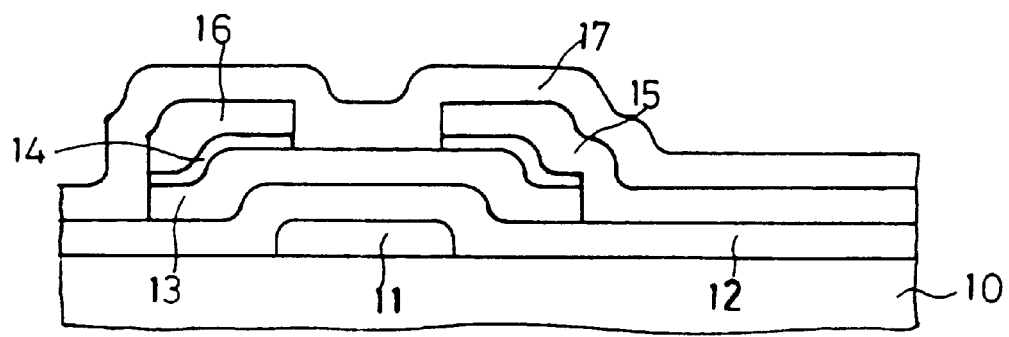
FIG. 1 is a cross-sectional view of a TFT-LCD for illustrating the structure of a conventional inverted-staggered TFT.
Figure 2:
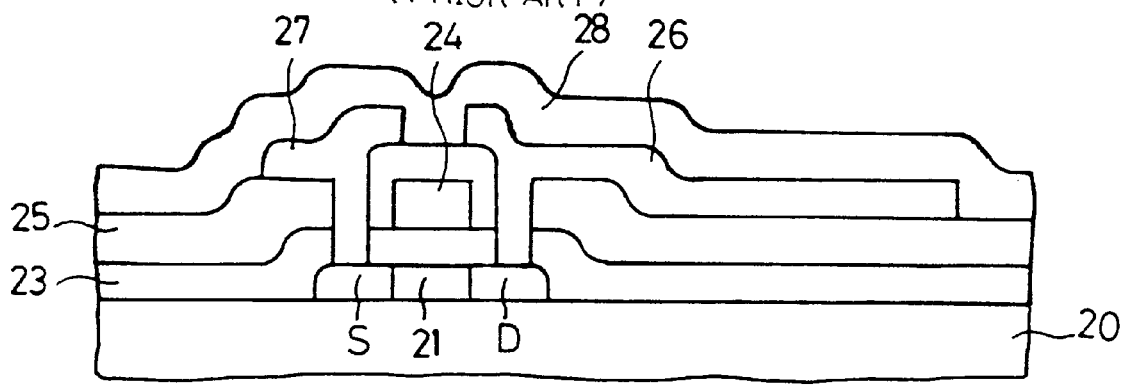
FIG. 2 is a cross-sectional view of a TFT-LCD for illustrating the structure of a conventional self-aligned top gate TFT.
Figure 3A:
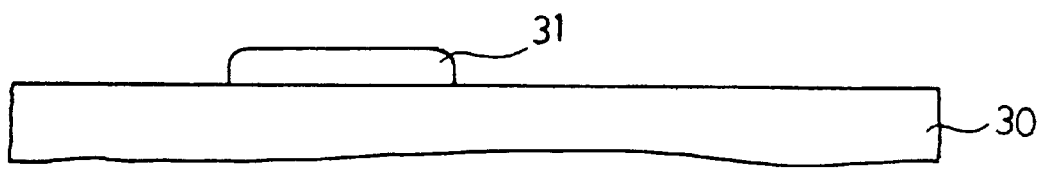
FIGS. 3A–3F illustrate the steps of manufacturing a TFT-LCD having an inverted-staggered TFT according to a first embodiment of the present invention.
Figure 3B:
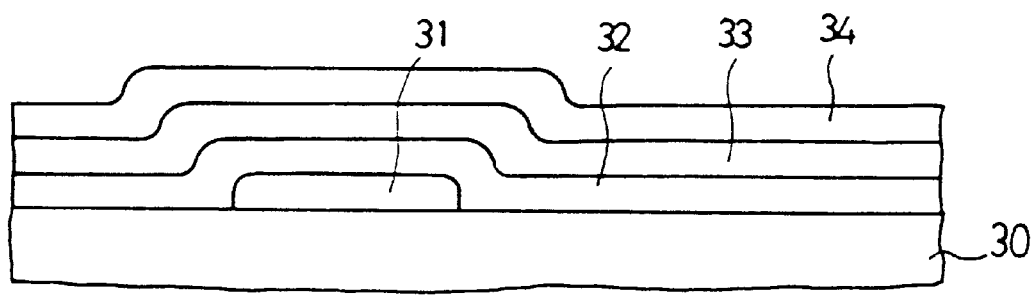
Figure 3C:
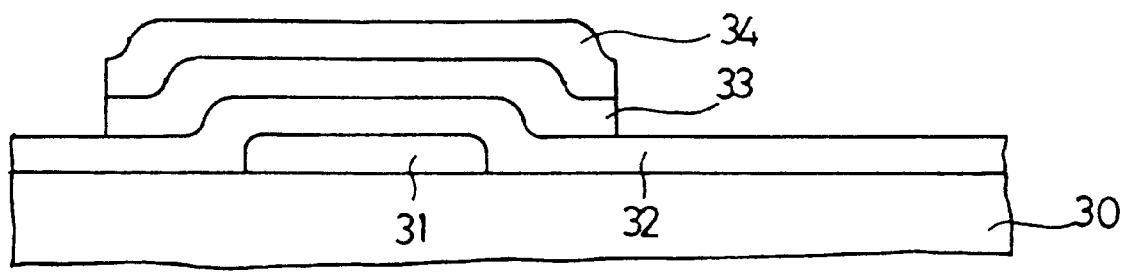
Figure 3D:
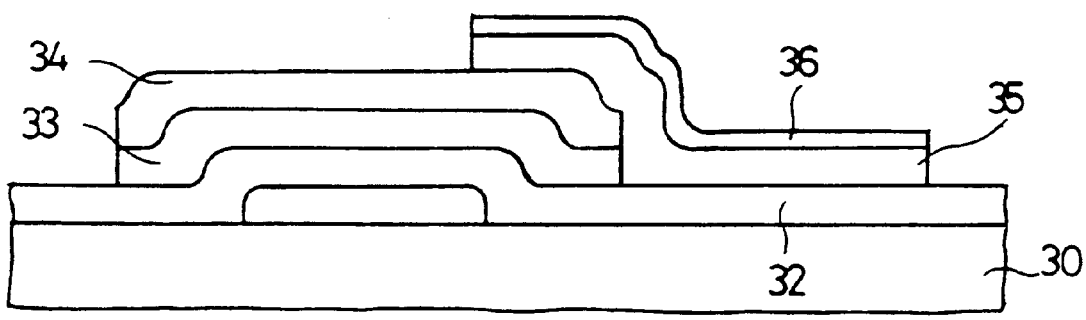
Figure 3E:
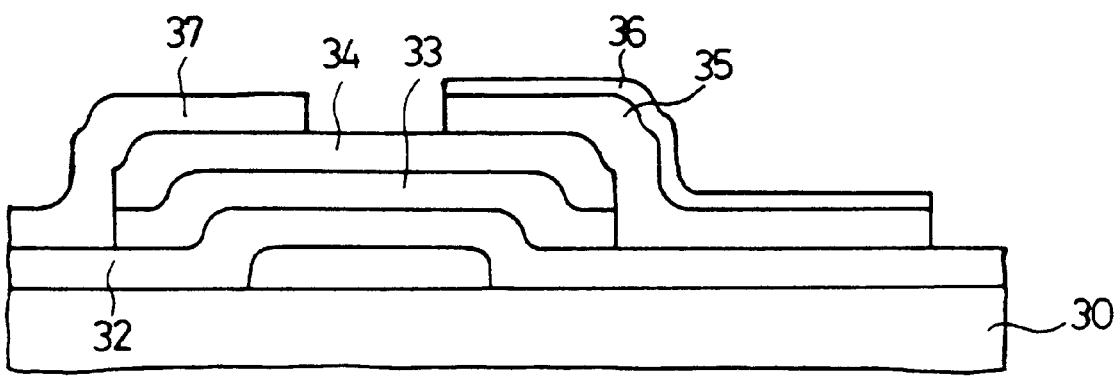
Figure 3F:
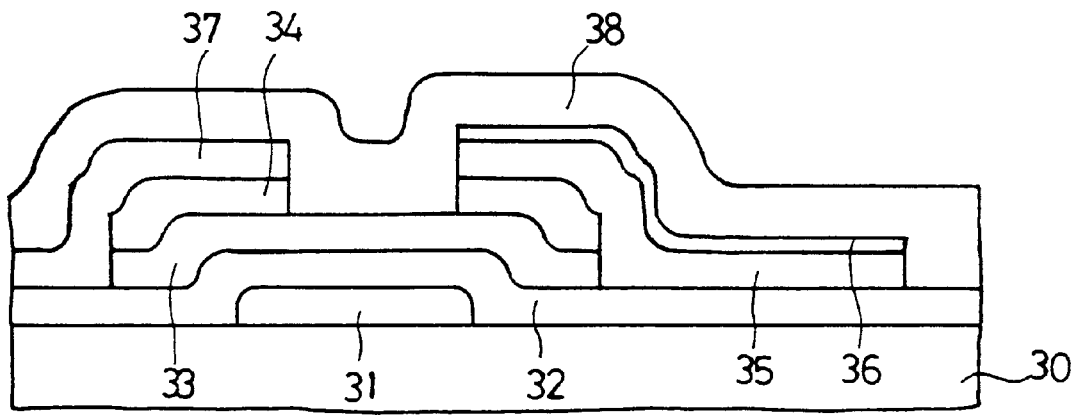

FIG. 3F shows a first embodiment of the TFT-LCD according to the present invention, which has an inverted-staggered TFT using amorphous silicon. A gate electrode 31 is formed over a glass substrate 30, and a gate insulating layer 32 is formed on the overall surface of the gate electrode 31 and the exposed glass substrate 30. An active layer 33, i.e., semiconductor layer of amorphous silicon, is formed over the gate insulating layer 32. An ohmic contact layer 34 (n$^+$a-Si:H) is formed on sides of the active layer 33. A source electrode 37 is on one side of the ohmic contact layer 34, and a drain electrode 35 is on the other side of ohmic contact layer 34. The drain electrode 35 extends to integrally form a pixel electrode over the gate insulating layer 32. A passivation layer 36 is formed on the integrally formed drain/pixel electrode 35. A surface passivation layer 38 is formed on the overall surface of the resultant structure.

A method for manufacturing a TFT-LCD according to the first embodiment of the present invention includes forming a gate electrode on an insulating substrate and sequentially stacking a gate insulating layer and semiconductor layer on the overall surface of the gate electrode and substrate. The semiconductor layer is sequentially patterned to thereby form an active layer. A transparent conductive layer and a transparent insulating layer are sequentially stacked and patterned on one side of the active layer and above the gate insulating layer, to thereby form an integrally formed drain/pixel electrode and passivation layer. A metal layer is deposited and patterned on the overall surface of the substrate to thereby form a source electrode and an integrally formed drain/pixel electrode. This procedure will be described in more detail with reference to FIGS. 3A to 3F.

FIGS. 3A–3F show the process of manufacturing the TFT-LCD having an inverted-staggered amorphous silicon TFT. As shown in FIG. 3A, a metal is coated on a glass substrate 30 and patterned to form a gate electrode 31.

As shown in FIG. 3B, a gate insulating layer 32, such as a nitride layer, an amorphous silicon layer 33, and an impurity-doped amorphous silicon layer 34 are sequentially deposited on the gate electrode 31 and over the glass substrate 30 As shown in FIG. 3C, the impurity-doped amorphous silicon layer 34 and the amorphous silicon layer 33 are patterned by photolithography to form a doped amorphous silicon layer 34 and active layer 33.

As shown in FIG. 3D, a transparent conductive material, for example, ITO, and a transparent insulating material are sequentially deposited on the overall surface of the substrate, and patterned to form a passivation layer 36 and an integrally formed drain/pixel electrode 35 on one side of the doped amorphous silicon layer 34 and over the gate insulating layer 32.

As shown in FIG. 3E, a metal, such as Al, is deposited on the overall surface of the substrate, and patterned through photolithography to form a source electrode 37 on the other side of amorphous silicon layer 34 and over the gate insulating layer. Here, since the source electrode 37 is formed of aluminum, for example, the passivation layer 36 is formed to protect the integrally formed drain/pixel electrode 35 from a solution or a gas for etching aluminum. For the source electrode, a low-resistance conductive material can also be used.

As shown in FIG. 3F, the doped amorphous silicon layer 34 is etched using the source electrode 37, the passivation layer 36, and the integrally formed drain/pixel electrode 35 as a mask, to thereby form an ohmic contact layer 34. Then, a transparent insulating layer is deposited on the overall surface of the substrate to form a surface passivation layer 38 for protecting the TFT and the pixel electrode.

Figure 4A:
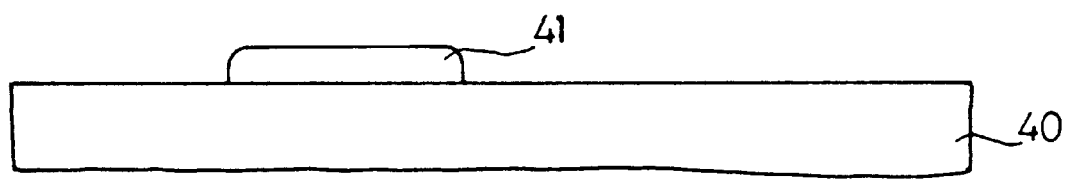
FIGS. 4A–4H illustrate the steps of manufacturing a TFT-LCD having a self-aligned top gate TFT according to a second embodiment of the present invention.
Figure 4B:
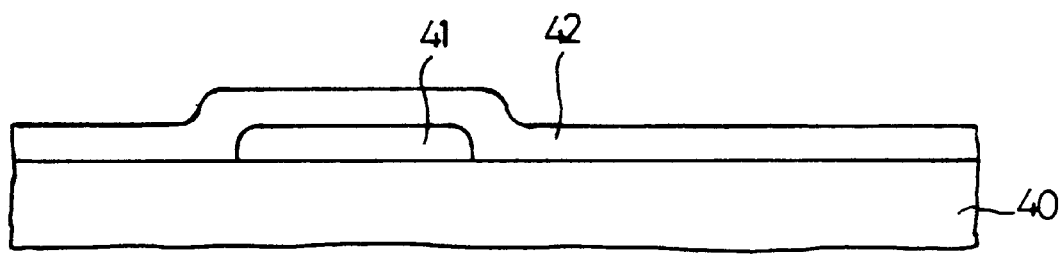
Figure 4C:
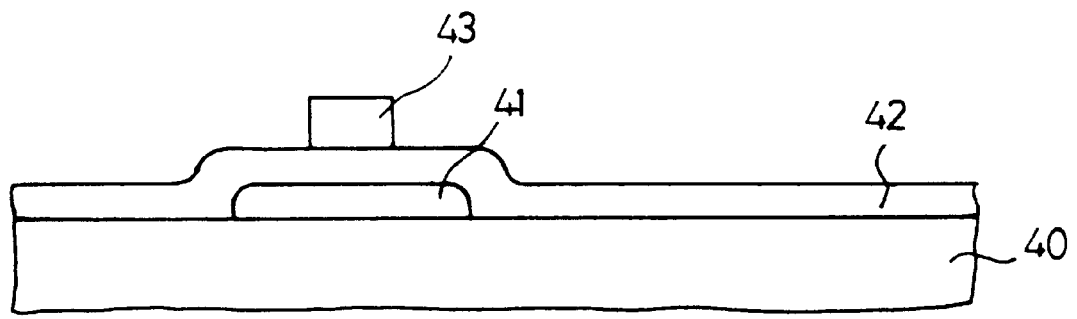
Figure 4D:
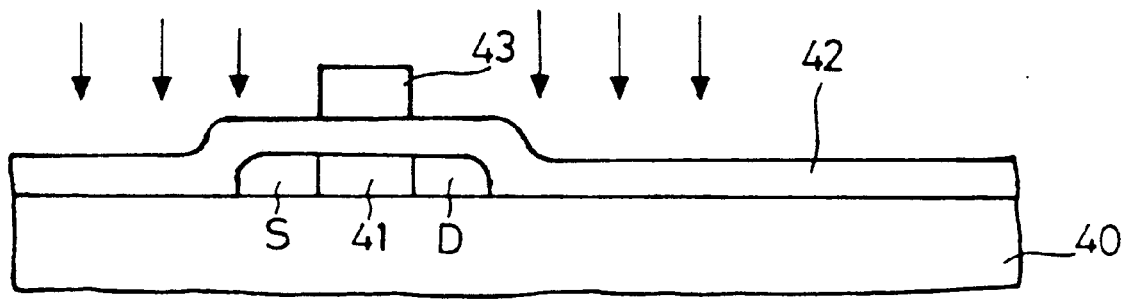
Figure 4E:
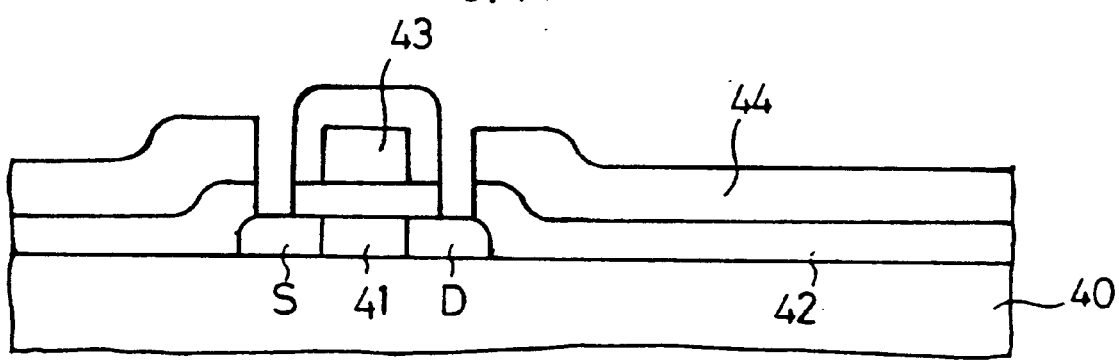
Figure 4F:
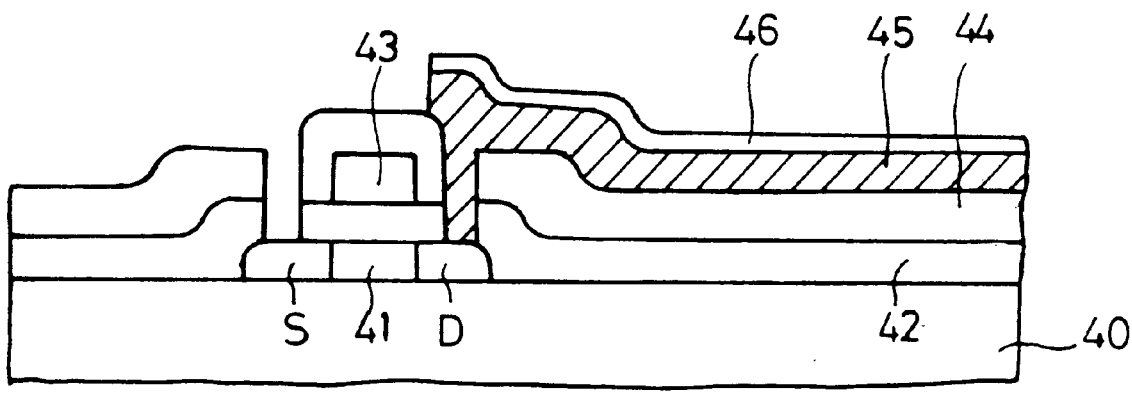
Figure 4G:
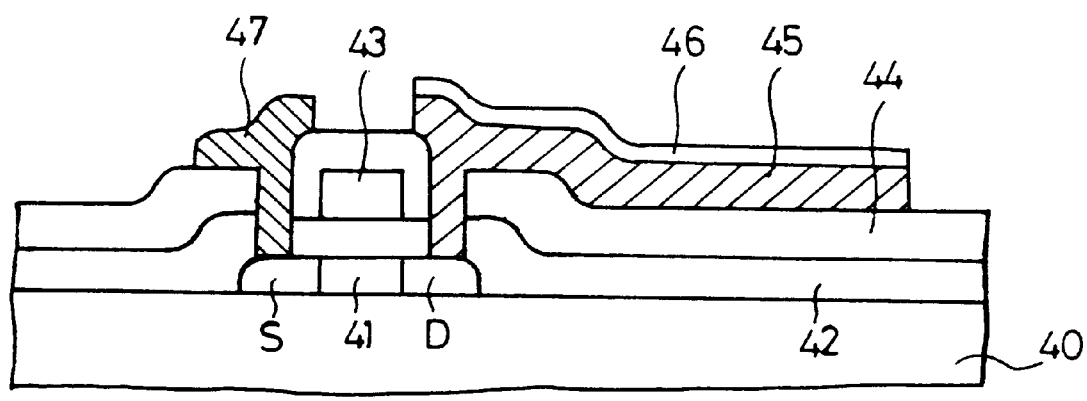
Figure 4H:
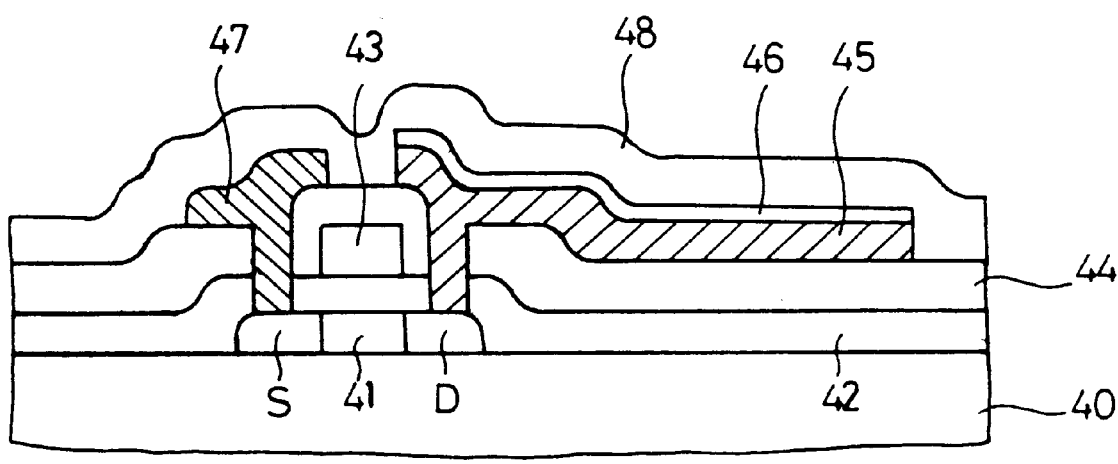

FIG. 4H shows a second embodiment of the TFT-LCD in accordance with the present invention, which has a self-aligned top gate TFT of a coplanar type using polysilicon.

As shown in FIG. 4H, an active layer 41 having source and drain regions (S/D) on respective sides is formed on a glass substrate 40. A gate insulating layer 42 is formed over the active layer 41 and the glass substrate 40. A gate electrode 43 is formed over the gate insulating layer 42 An interlevel insulating layer 44 is formed over the gate electrode 43 and the gate insulating layer 42. Two contact holes are formed through the gate insulating layer 42 and the interlevel insulating layer 44 over the source and drain regions. A source electrode 47 is formed at the contact hole corresponding to the source region S and over the interlevel insulating layer 44 An integrally formed drain/pixel electrode 45 is formed at the contact hole corresponding to the drain region and over the interlevel insulating layer 44. A passivation layer 46 is formed on the integrally formed drain/pixel electrode 45 for protecting the drain/pixel electrode during etching of the source electrode. A surface passivation layer 48 is formed on the resultant structure. Here, the source/drain region may include a heavily-doped impurity region, a lightly doped drain (LDD), or an offset region.

A method for manufacturing a TFT-LCD according to the second embodiment of the present invention includes forming an active layer on an insulating substrates and forming a gate insulating layer on the active layer and the substrate. A gate electrode is formed on the gate insulating layer. Ions are implanted using the gate electrode as a mask to thereby form a source/drain region on the active layer. An insulating material is deposited above the gate electrode and the gate insulating layer to thereby form an interlevel insulating layer. The interlevel insulating layer and the gate insulating layer are selectively removed to form contact holes above the source and drain regions. A transparent conductive layer and a transparent insulating layer are sequentially formed and patterned over the drain region and on the interlevel insulating layer. The transparent conductive layer contacts the drain region through one of the contact holes and is integrally formed as a drain/pixel electrode. The transparent insulating layer is a passivation layer. A metal layer is formed on the interlevel insulating layer and contacts the source region through the other contact hole to thereby form a source electrode. This process will be explained in more detail with reference to FIGS. 4A to 4H.

As shown in FIG. 4A, a polysilicon layer is deposited on a glass substrate 40, and patterned by photolithography to form an active layer 41. As shown in FIG. 4B, an insulating layer is formed on the active layer 41 and the substrate 40 to form a gate insulating layer 42. As shown in FIG. 4C, a conductive material, such as metal, is deposited on the gate insulating layer 42, and patterned to form a gate electrode 43.

As shown in FIG. 4D, high-concentration ions are implanted into the active layer 41 using the gate electrode 43 as a mask to define source and drain regions S and D. Here, an LDD region or an offset region may be added at the active layer 41.

As shown in FIG. 4E, an insulating layer is deposited on the overall surface of the substrate to form an interlevel insulating layer 44. Contact holes are formed through the interlevel insulating layer 44 and the gate insulating layer 42 to expose portions of the source and drain regions S and D.

As shown in FIG. 4F, a transparent conductive material, for example, ITO, and a transparent insulating material, for example, silicon nitride layer or silicon oxide layer, are sequentially deposited on the interlevel insulating layer. The transparent conductive material contacts the drain region through the contact hole. The transparent conductive and insulating materials are patterned together by photolithography to form a passivation layer 46 and an integrally formed drain/pixel electrode 45.

As shown in FIG. 4G, a metal (Al) is deposited on the interlevel insulating layer and inside the contact hole to contact the source region. The metal is etched to form a source electrode 47 (signal wire). A low-resistance conductive material can also be based for the source electrode in accordance with the present invention.

As shown in FIG. 4H, a surface passivation layer 48 is formed of a transparent insulating material in order to protect the TFT and the pixel electrode.

According to the embodiments of the present invention, drain and pixel electrodes are integrally formed from a single transparent conductive layer at the same time. A protective passivation layer is formed thereon, and then, the source electrode is patterned. The protective passivation layer of the present invention prevents the transparent conductive layer forming the drain/pixel electrode from being damaged while using an etchant for patterning the source electrode. Thus, device characteristic and yield are enhanced in accordance with the present invention.

It will be apparent to those skilled in the art that various modifications and variations can be made in the TFT-LCD and method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for manufacturing a thin film transistor having a substrate for a liquid crystal display, he method comprising the steps of:

forming a gate electrode over the substrate;

forming a first insulating layer over the gate electrode;

forming a first semiconductor layer over the first insulating layer;

forming a second semiconductor layer over the first semiconductor layer, the second semiconductor layer having first and second portions;

forming a first conductive layer over the second semiconductor layer, the first conductive layer being in contact with the first portion of the second semiconductor layer;

forming a second insulating layer on the first conductive layer; and forming a second conductive layer over the second semiconductor layer, the second conductive layer being in contact with the second portion of the second semiconductor layer, the step of forming the second conductive layer including patterning the second conductive layer to form a source electrode, wherein the second insulating layer protects the first conductive layer during the step of patterning the second conductive layer.

2. The method for manufacturing a thin film transistor according to claim 1, wherein the step of forming the second semiconductor layer includes selectively etching the second semiconductor layer to form an ohmic contact layer.

3. The method for manufacturing a thin film transistor according to claim 1, wherein the step of forming the first conductive layer includes patterning the first conductive layer to form drain and pixel electrodes as an integral electrode.

4. The method for manufacturing a thin film transistor according to claim 1, the method further comprising the step of forming a third insulating layer over a resultant structure of the substrate.

5. The method for manufacturing a thin film transistor according to claim 1, wherein the first semiconductor layer includes amorphous silicon.

6. The method for manufacturing a thin film transistor according to claim 1, wherein the second insulating layer includes one of silicon oxide and silicon nitride.

7. The method for manufacturing a thin film transistor according to claim 1, wherein the second conductive layer includes metal.

8. The method for manufacturing a thin film transistor according to claim 1, wherein the first conductive layer and the second insulating layer are both transparent.

9. A method for manufacturing a thin film transistor having a substrate for a liquid crystal display, the method comprising the steps of:

forming an active layer over the substrate;

forming a first insulating layer over the active layer;

forming a gate electrode over the first insulating layer;

forming source and drain regions in the active layer;

forming a second insulating layer on the gate electrode and forming contact holes exposing potions of the source and drain regions;

forming a first conductive layer over the second insulating layer, the first conductive layer contacting the drain region through one of the contact holes;

forming a third insulating layer on the first conductive layer; and forming a second conductive layer over the second insulating layer, the second conductive layer contacting the source region through another one of the contact holes, the step of forming the second conductive layer including patterning the second conductive layer to form a source electrode, wherein the third insulating layer protects the first conductive layer during the step of patterning the second conductive layer.

10. The method for manufacturing a thin film transistor according to claim 9, Wherein the step of forming the first conductive layer includes patterning the first conductive layer to form drain and pixel electrodes as an integral electrode.

11. The method for manufacturing a thin film transistor according to claim 9, the method further comprising the step of forming a fourth insulating layer over a resultant structure of the substrate.

12. The method for manufacturing a thin film transistor according to claim 9, wherein the active layer includes polysilicon.

13. The method for manufacturing a thin film transistor according to claim 9, wherein the third insulating layer includes one of silicon oxide and silicon nitride.

14. The method for manufacturing a thin film transistor according to claim 9, wherein the second conductive layer includes metal.

15. The method for manufacturing a thin film transistor according to claim 9, wherein the first conductive layer and the third insulating layer are both transparent.

16. The method for manufacturing a thin film transistor according to claim 9, wherein the step of forming the source and drain regions in the active layer includes the step of doping impurities into the active layer.

* * * * *